United States Patent
Kinzer

(10) Patent No.: US 7,462,910 B1
(45) Date of Patent: Dec. 9, 2008

(54) P-CHANNEL TRENCH MOSFET STRUCTURE

(75) Inventor: Daniel M. Kinzer, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/292,186

(22) Filed: Apr. 15, 1999

Related U.S. Application Data

(60) Provisional application No. 60/104,148, filed on Oct. 14, 1998.

(51) Int. Cl.
  *H01L 29/76* (2006.01)
  *H01L 29/94* (2006.01)
  *H01L 31/062* (2006.01)
  *H01L 31/113* (2006.01)

(52) U.S. Cl. .................. 257/330; 257/331; 257/341; 257/342

(58) Field of Classification Search .......... 257/329, 257/332, 340–342, 330, 331, 328; 438/270, 438/587
See application file for complete search history.

(56) References Cited

U.S. PATENT DOCUMENTS

| | | | |
|---|---|---|---|
| 4,333,224 A * | 6/1982 | Buchanan | 438/149 |
| 4,516,143 A * | 5/1985 | Love | 257/341 |
| 4,568,958 A | 2/1986 | Baliga et al. | |
| 4,859,621 A | 8/1989 | Einthoven | |
| 4,961,100 A | 10/1990 | Baliga et al. | |
| 5,674,766 A * | 10/1997 | Darwish et al. | 438/270 |
| 5,701,023 A * | 12/1997 | Bulucea et al. | 257/341 |
| 6,069,043 A * | 5/2000 | Floyd et al. | 438/270 |
| 6,090,716 A * | 7/2000 | Floyd et al. | 438/700 |

FOREIGN PATENT DOCUMENTS

| | | |
|---|---|---|
| GB | 2077495 | 12/1981 |
| WO | 9413017 | 6/1994 |
| WO | 9630947 | 10/1996 |
| WO | 9638862 | 12/1996 |

OTHER PUBLICATIONS

A High-Density Ultra-Low Rdson 30 Volt N-Channel Trench FETs for DC/DC Converter Applications, El Segundo CA, pp. 1-4, Sodhi R; Malik R; Asselanis D; and Kinzer D, "Proceedings of International Symposium of Power Semiconductor Devices and ICs (ISPSD)", May 26, 1999. IEEE Catalog #99CH36312, pp. 303-306.

(Continued)

*Primary Examiner*—Shouxiang Hu
(74) *Attorney, Agent, or Firm*—Ostrolenk, Faber, Gerb & Soffen, LLP

(57) ABSTRACT

A low voltage P-channel power MOSFET using trench technology has an epitaxially deposited constant concentration N channel region adjacent the side walls of a plurality of trenches. The constant concentration channel region is deposited atop a P$^+$ substrate and receives P$^+$ source regions at the tops of each trench. The source contact is connected to both source and channel regions for a unidirectional conduction device, or only to the source regions for a bidirectional device.

4 Claims, 4 Drawing Sheets

OTHER PUBLICATIONS

Ultra-Low Rdson 12 v P-Channel Trench MOSFET, El Segundo CA, pp. 1-4, Kinzer D; Asselanis D; and Carta R, "Proceedings of International Symposium of Power Semiconductor Devices and ICs (ISPSD)", May 26, 1999. IEEE Catalog #99CH36312, pp. 307-310.

Integrated Design Environment for DC/DC Converter FET Optimization, El Segundo CA, pp. 1-4, Sodhi R; Brown S Sr.; and Kinzer D.; Dallas TX, Martinez R; Stanford CA, Wiemer M, "Proceedings of International Symposium of Power Semiconductor Devices and ICs (ISPSD)", May 26, 1999. IEEE Catalog #99CH36312, pp. 241-244.

* cited by examiner

P-CHANNEL TRENCH MOSFET STRUCTURE

RELATED APPLICATIONS

This application is related to application Ser. No. 08/299,533, filed Sep. 1, 1994 entitled PROCESS FOR MANUFACTURE OF MOS GATED DEVICE WITH REDUCED MASK COUNT now U.S. Pat. No. 5,795,793; and application Ser. No. 60/104,148, filed Oct. 14, 1998 entitled MOSGATED DEVICE WITH TRENCH STRUCTURE AND REMOTE CONTACT AND PROCESS FOR ITS MANUFACTURE (IR-1461).

BACKGROUND OF THE INVENTION

This invention relates to power MOSgated devices and more specifically relates to a novel low voltage P-channel MOSFET having a reduced switching loss.

Power Mosgated devices are well known and include such devices as power MOSFETs; IGBTs; gate controlled thyristors and the like. In low voltage applications of such devices, particularly in connection with battery operated portable electronic devices, such as personal computers, cellular telephones and the like, frequently termed wireless systems, careful power management is essential to extend the battery life and its usage between charges.

Power management applications in wireless systems fall generally into two categories. One category is charging the battery from an external DC source. it is important to control both the charging current and voltage correctly for the particular battery technology. This control is accomplished by modulating the duty cycle of a transistor placed between the power source and the battery in well known ways. The second category activates a portion of the system on demand. In this case the transistor is placed between the battery and the load to be activated, such as an RF power amplifier. In some systems, multiple power supply voltages require DC/DC conversion as well. This may be accomplished with well known low dropout linear regulators or buck and boost switching regulators.

Both N-channel and P-channel power MOS transistors as the transistor in the above applications are available. P-channel devices are generally easier to use in these circuits. Thus, when the P-channel MOSFET is placed in the power bus, it can be controlled with a logic input that switches between the power rail and ground. This allows a single uninterrupted ground for the whole system. N-channel devices in the power bus require a gate signal that is boosted to a voltage higher than the bus, which requires extra circuitry.

In the past, the simplicity of a P-channel device came at the price of increased losses. This is because P-channel devices rely on hole conduction, and holes have a lower carrier mobility in silicon than electrons. The on-resistance of the active transistor is proportional to the carrier mobility, and its losses are proportional to the on-resistance, $R_{DSON}$.

To overcome this limitation, the length of the resistive path should be minimized and the width maximized within the transistor. The number of holes in the path must also be maximized. One way to do this is to lower the maximum voltage rating as much as possible which permits the use of lower resistivity and higher dopant concentration silicon.

Since most batteries operate at only a few volts, a 12V rating is generally more than enough for a transistor in a wireless application. Previously available devices are rated at 20V, and have a reasonably low value of $R_{DSON}$ at 2.5V gate to source. These parts come in various die sizes and package styles, ranging from the Micro 3 (SOT23) up to the SO8. The values listed in the following Table are for single transistors in a package, though the Micro 8 and SO8 packages also have dual versions. The power loss using these devices can be as high as 9% which translates directly into reduced usage.

| Load Current | Part Number | Package Style | $R_{DSON}$ @ 2.5 V | $V_{drop}$ or $P_{diss}$ (as % of 5 V supply) |
|---|---|---|---|---|
| 500 mA | IRLML6302 | Micro 3 ™ | 0.9 Ω | 9% |
| 1 A | IRLMS6702 | Micro 6 ™ | 0.4 Ω | 8% |
| 2 A | IRF7604 | Micro 8 ™ | 0.13 Ω | 5% |
| 4 A | IRF7416 | SO-8 | 0.035 Ω | 3% |

It is known that a low voltage power MOSFET can be made with trench type technology to obtain reduced $R_{DSON}$, gate to drain capacitance, and to reduce $Q_g$ (gate charge). Switching losses are proportional to the product of the device $R_{DSON}$ and $Q_g$ so it would be desirable to also reduce $R_{DSON}$ in such devices. The present P-channel trench type power MOSFET uses a P-type substrate with a P-type epitaxial layer thereon. The device channel regions are formed by deep N-type diffusions from the top surface of the epitaxial layer, followed by P-type source diffusions. The voltage is then mostly blocked in the P-type epitaxial layer, resulting in a fairly large resistive drop, and in increased losses in a wireless system. These losses in turn reduce battery life between charges.

BRIEF DESCRIPTION OF THE INVENTION

In accordance with the invention, in a P-channel trench type MOSgated device, the conventional P-type substrate epitaxial layer is eliminated and the diffused channel is replaced by an epitaxially grown N-type channel region. The channel region now has a uniform concentration, and the relatively lower doping of the channel region allows voltage to be blocked in the channel region and reduces the threshold voltage $V_T$ for turn-on. Thus, with the novel structure, a major component of the on-resistance is removed and the device can be completely turned on at a gate to source voltage of 2.5 volts.

When the novel die of the invention is packaged in the same packages reported in the above Table, the $R_{DSON}$ and power loss has been reduced up to 4 times, as shown in the following Table:

| Load Current | Part Number | Package Style | $R_{DSON}$ @ 2.5 V | $V_{drop}$ or $P_{diss}$ (as % of 5 V supply) |
|---|---|---|---|---|
| 500 mA | | Micro 3 ™ | 0.18 Ω | 1.8% |
| 1 A | | Micro 6 ™ | 0.075 Ω | 1.5% |
| 2 A | | Micro 8 ™ | 0.025 Ω | 1% |
| 4 A | | SO-8 | 0.010 Ω | .8% |

Thus, as shown above, overall circuit losses are reduced to less than 2% even at the discharged battery 2.5 volt condition.

DETAILED DESCRIPTION OF THE DRAWINGS

Figure 1:
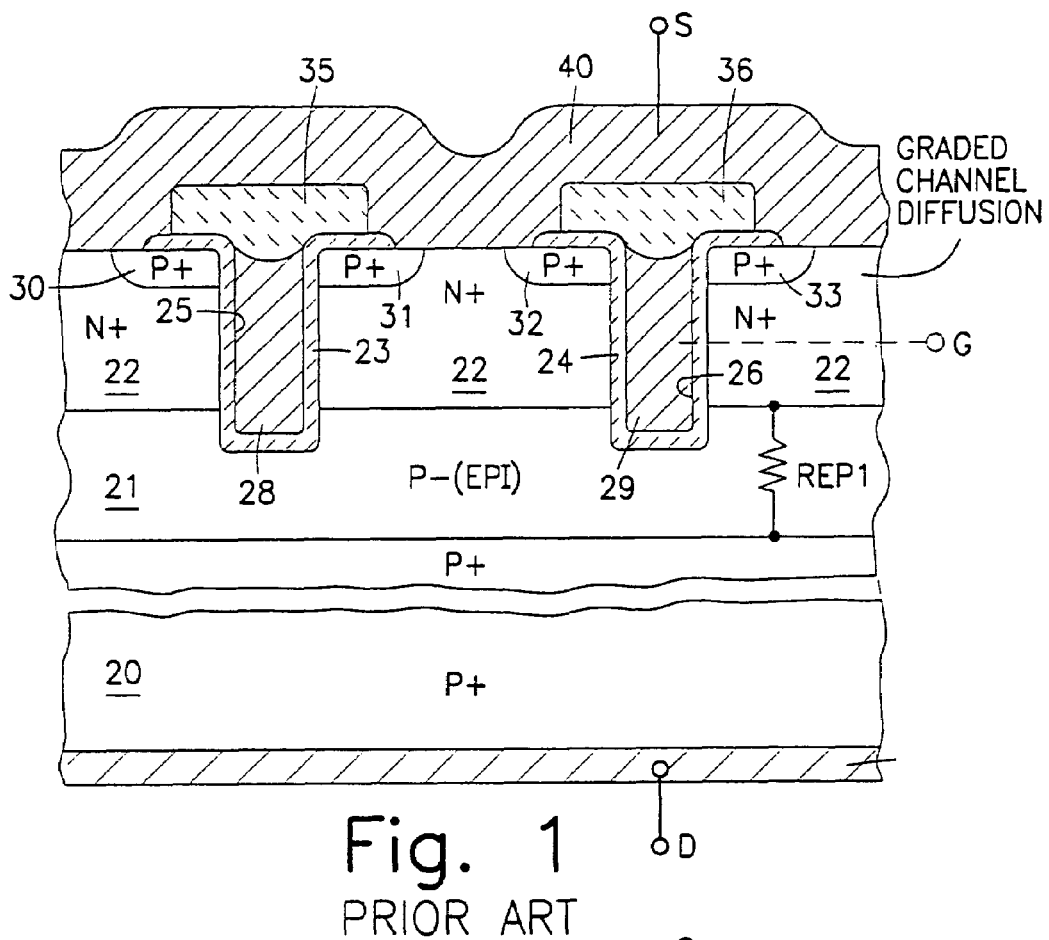
FIG. 1 is a cross-sectional view of the junction pattern of a single cell of a prior art type of trench type P-channel MOSFET.

Referring first to FIG. 1, there is shown one "cell" of a prior art P-channel trench type MOSFET. The single cell shown will be replicated any number of times over the surface of a chip.

Thus, the device has a $P^+$ doped substrate 20 which has an epitaxially deposited, lightly doped $P^-$ layer 21 thereon. An $N^+$ channel diffusion 22 is diffused into the upper surface of $P^-$ layer 21 and is, therefore a graded diffusion. Trenches such as spaced trenches 23 and 24 are etched into the upper surface of the wafer or chip which is shown and extend below the bottom of channel diffusion 22. These trenches are lined with a gate insulation layer, such as an oxide, shown as gate oxide layers 25 and 26 in trenches 23 and 24 respectively and are filled with conductive polysilicon gates 28 and 29 respectively which are connected to one another (not shown) and to a common gate electrode. $P^+$ source diffusions 30, 31, 32 and 33 are formed at the top of trenches 23 and 24 respectively. Note that trenches 23 and 24 may be elongated stripe structures and that source regions 30 to 33 will also be elongated stripes. However, trenches 23 and 24 may also be polygonal in topology, in which case, the $P^+$ sources will surround respective trenches. Trenches may also surround the polygonal $P^+$ sources. Oxide insulation plugs 35 and 36 overlie polysilicon stripes 28 and 29 and insulate the polysilicon stripes from an overlying aluminum source contact 40. Source contact 40 contacts source regions 30, 31, 32 and 33 as well as the channel diffusion 22 in the usual manner. A drain contact 41 is connected to the bottom of the die to complete the vertical conduction trench device.

In operation, a sufficiently high gate voltage must be applied to polysilicon gates 28 and 29 to cause the graded channel diffusion 22 to invert along its entire length from sources 30 to 33 to the $P^-$ epi layer 21. Thus, a relatively high gate voltage is needed to ensure inversion of the higher concentration portions of the channel diffusion. Further, once the device is turned on, carriers flowing between drain 41 and source 40 see the relatively high resistance $R_{epi}$ of layer 21, thus causing an increased $R_{DSON}$ for the devices.

The present invention provides a novel structure which permits the use of a lower gate voltage and which has a lower $R_{DSON}$ in a P-channel trench type MOSgated device. This device is shown in FIG. 2 where components similar to those of FIG. 1 have the same identifying numerals.

Figure 2:
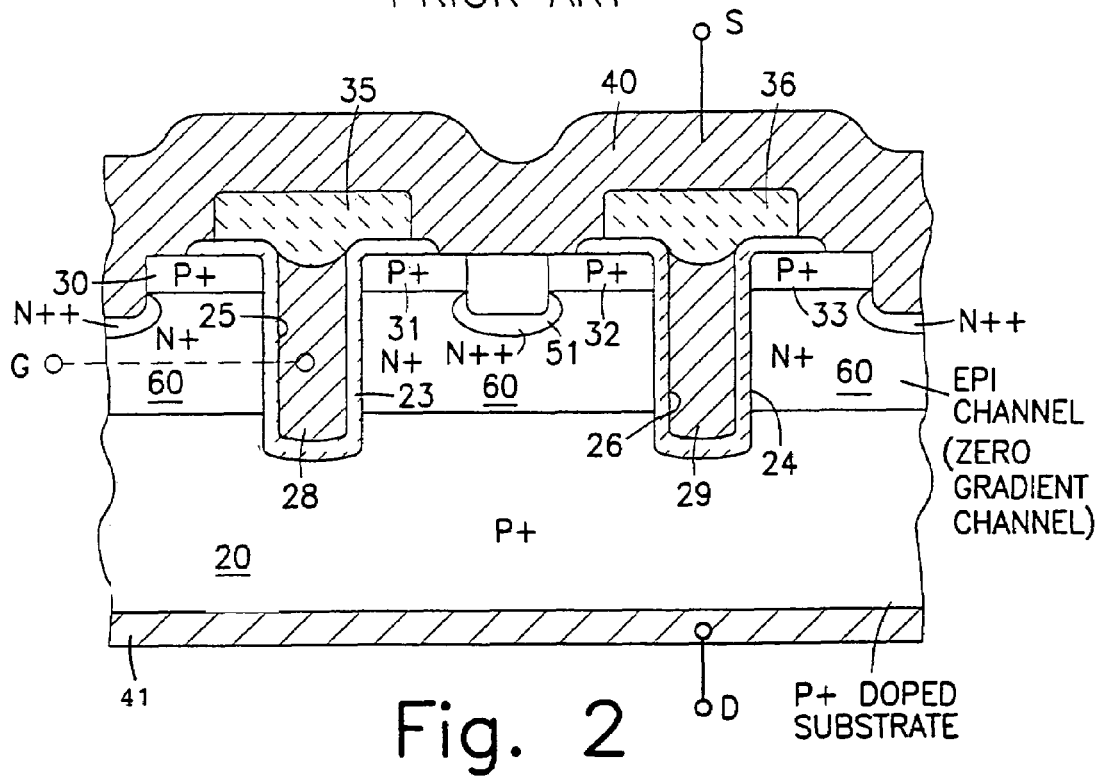
FIG. 2 is a cross-section like that of FIG. 1, but illustrates the junction pattern and structure of the present invention.

It will first be noted that the source contact in FIG. 2 is made to $P^+$ source stripes 30, 31, 32 and 33 in the manner shown in copending application (IR-1113) Ser. No. 08/299, 533 now U.S. Pat. No. 5,795,793. Thus, a notch 50, for example, is etched through the $P^+$ source stripes to enable the source electrode 40 to contact the $P^+$ source stripes 31-33 and the underlying N-type channel regions. An $N^{++}$ diffusion 51 may also underlie the bottom of the control notch to improve the contact between aluminum source 40 and silicon 60.

In accordance with the invention, the graded channel diffusion 22 and $P^-$ epi layer 21 of FIG. 1 are replaced by an $N^+$ epitaxially grown layer 60, grown directly on $P^+$ substrate 20. The $N^+$ layer 60 has a constant concentration along its full depth (a zero vertical gradient), and receives the various trench structures 23, and 24. Its concentration is selected to provide a low threshold voltage $V_T$. $P^+$ sources 30 to 33 are diffused into the top of $N^+$ epi layer 60.

As a result of the new structure, a reduced threshold voltage can be obtained, to allow about 2.5 volts to turn the device fully on, because the concentration along the full length of the invertible layer adjacent the trench side walls is uniformly low. Further, the on resistance of the device is reduced because the resistance component $R_{epi}$ in FIG. 1 is removed from the device of FIG. 2.

Figure 4:
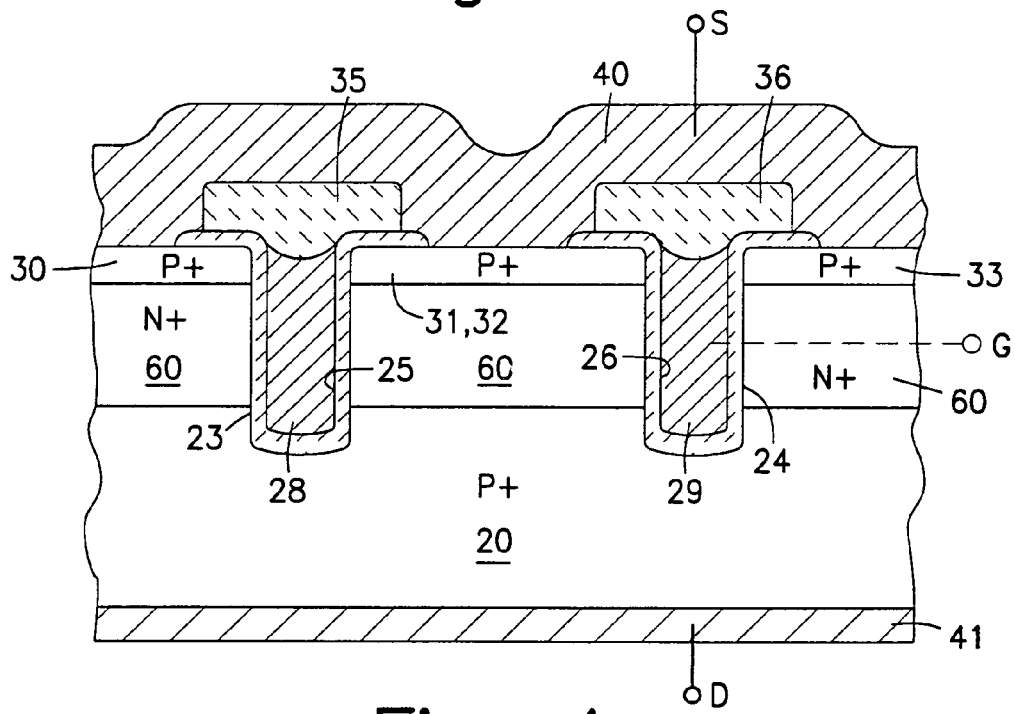
FIG. 4 is a cross-section similar to that of FIG. 2, but shows a revised junction pattern by which a bidirectional MOSFET is formed.

The device of FIG. 1 or 2 can also be made as a bidirectional MOSFET as shown in FIG. 4 for the device of FIG. 2. Thus, the device of FIG. 4 is identical to that of FIG. 2 except that the source contact 40 contacts only the $P^+$ source regions 30-33, and does not contact channel region 60.

Figure 3:
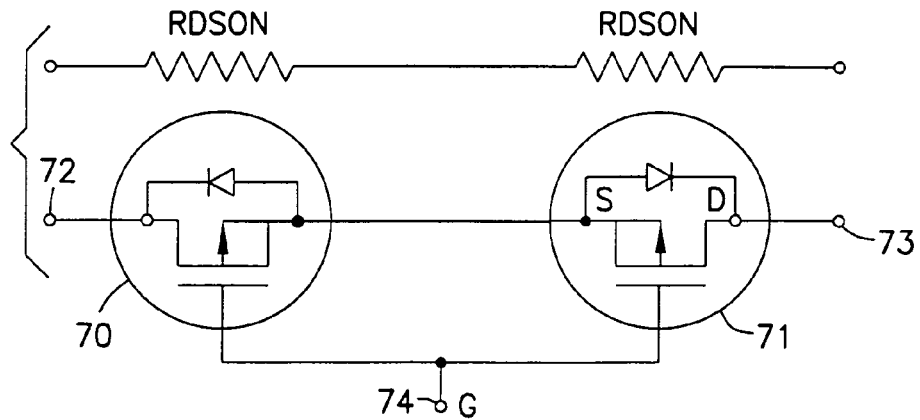
FIG. 3 shows a circuit diagram of two MOSFETs like those of FIG. 1 or 2, connected to form a bidirectionally conductive device.
Figure 5:
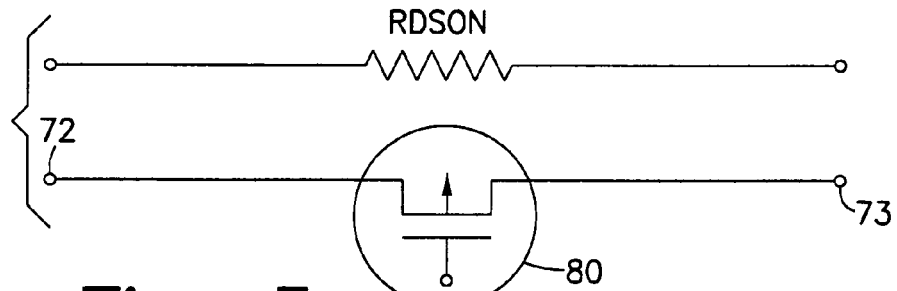
FIG. 5 is a circuit diagram of the bidirectional FET of FIG. 4.

The structure of FIG. 4 provides a single bidirectional MOSFET using less silicon area and having less on-resistance than that of two series connected MOSFETs such as those of FIGS. 1 and 2 to create a bidirectionally controlled circuit. Thus, in the past, two vertical conduction MOSFETs 70 and 71 must be connected in series between terminals 72 and 73, and will have a common gate terminal 74 to permit bidirectional control of circuit at terminals 72 and 73, as shown in FIG. 3. By contrast, as shown in FIG. 5, device 80, which is the device of FIG. 4, will provide bidirectional control between terminals 72 and 73. However, the device and circuit of FIGS. 4 and 5 will have one-half of the $R_{DSON}$ of the circuit of FIG. 3, and will have one half of the silicon area.

FIGS. 6 through 10 describe a preferred process to manufacture the device of FIG. 2. Similar numerals of FIGS. 1 and 2 describe similar elements in FIGS. 6 through 10.

The starting wafer for the process for a 12 volt P-channel device is a boron doped $P^+$ substrate 20 having a resistivity of less than 0.005 ohm cm and a thickness of 375 μm. An $N^+$ epitaxial layer 60 is grown atop substrate 20 and is phosphorous doped with a resistivity of 0.17 ohm cm and a thickness of 2.5 μm.

Figure 6:
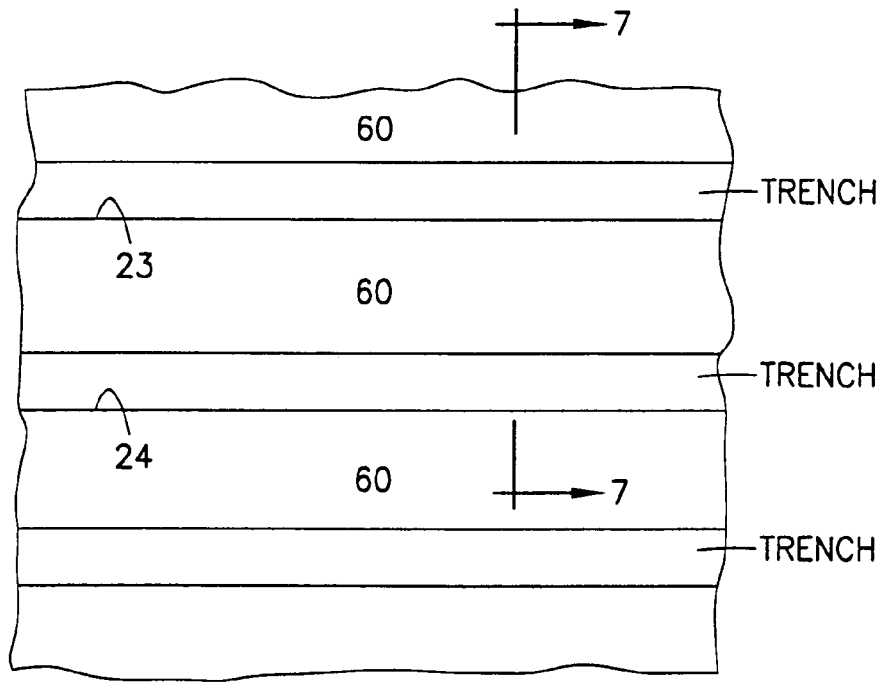
FIG. 6 is a top view of a portion of the silicon substrate used to make the device of FIG. 2.
Figure 7:
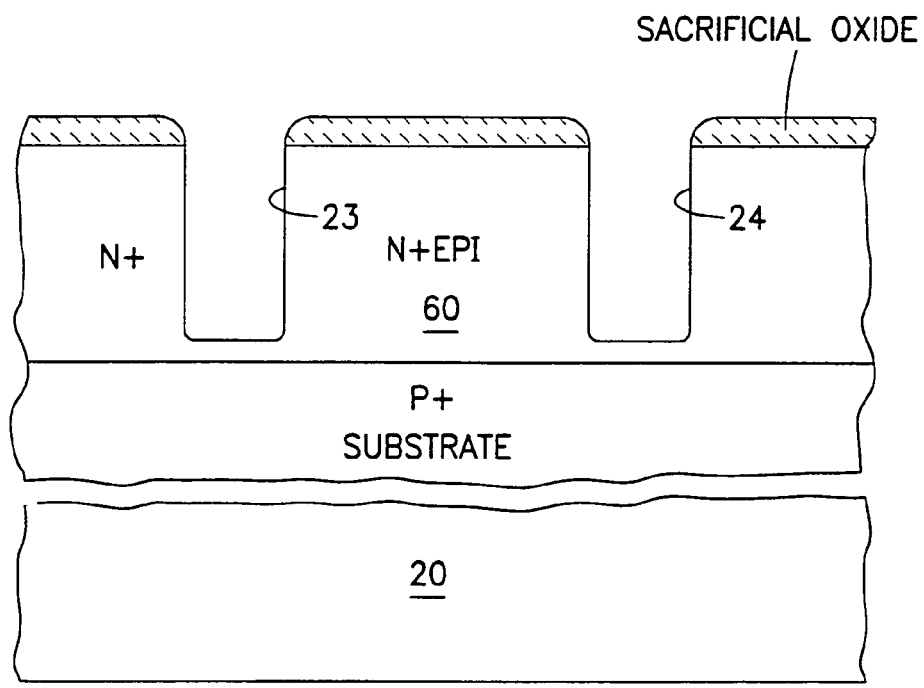
FIGS. 7, 8, 9 and 10 show the appearance of the cross-section of the silicon of FIG. 6, taken across section line 7-7 in FIG. 6, following various process steps.

The first major step, shown in FIGS. 6 and 7, is the formation of a trench mask atop the epitaxial layer 60, and the etching of trenches 23, 24 and others, to a depth of about 1200 Å. The trench sidewalls are then prepared for gate oxidation and an initial sacrificial oxidation is carried out, leaving the device as shown in FIG. 7.

Figure 8:
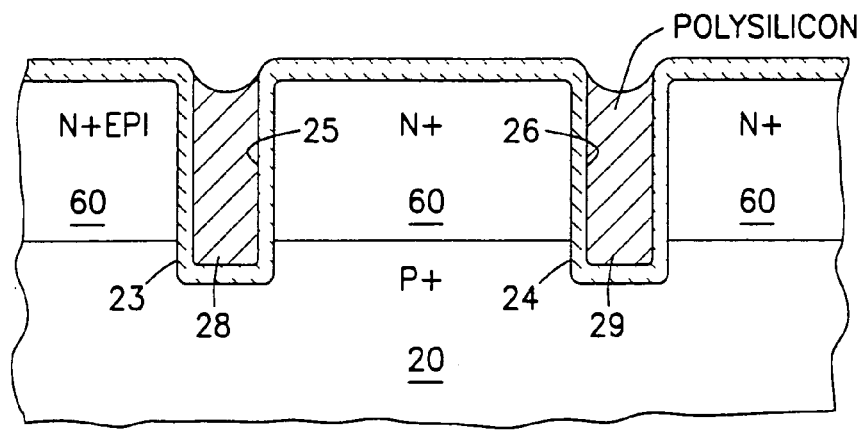

Thereafter, and as shown in FIG. 8, gate oxide layers 25 and 26 are grown inside the trench walls (and over the upper silicon surface). The gate oxide is grown for 30 minutes at 950° C. 02/TCA.

Next, and as also shown in FIG. 8, polysilicon is grown over the upper surface of the wafer and into the trenches as polysilicon gates 28 and 29. The polysilicon is grown to a thickness of about 7,500 Å. After the polysilicon is grown, it is made conductive by a boron implant with a dose of 1E14 and an energy of 80 KeV. This implant is followed by an anneal and drive step at 1050° C. for 60 minutes in nitrogen. A mask is then applied to etch the polysilicon off the top of the active device surface (the termination is not described herein and is conventional) and the wafer then appears as shown in FIG. 8.

Thereafter, there is a polyoxidation step at 975° C. for 40 minutes at 02/TCA to grow oxide atop the poly in each trench.

Figure 9:
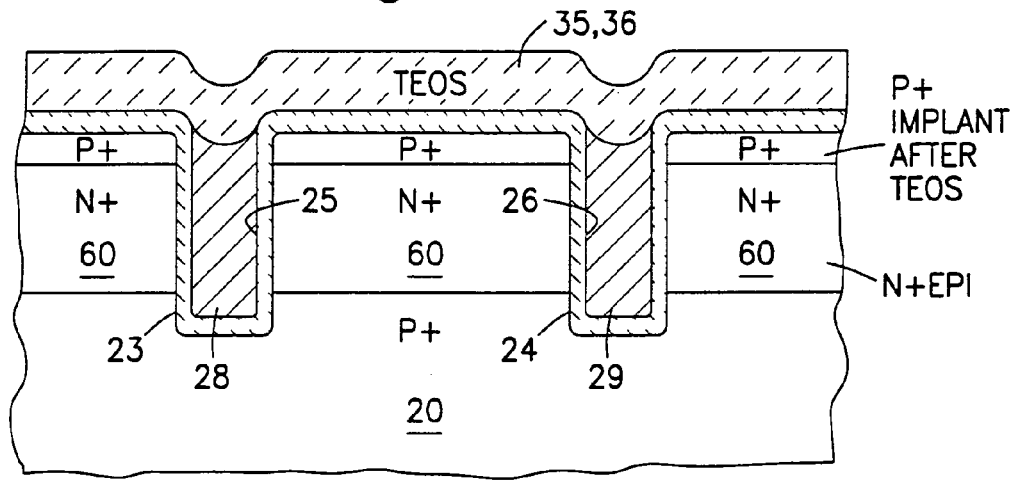

The source implant step is then carried out to form the P⁺ implants shown in FIG. 9, which will become the P⁺ source regions 30 to 33 of FIG. 2. The source implant in FIG. 9 is a boron implant at a dose of 2E15 and an energy of 50 KeV. Next, as shown in FIG. 9, a TEOS insulation layer 35, 36 is deposited atop the wafer to a thickness of 7,500 Å.

Figure 10:
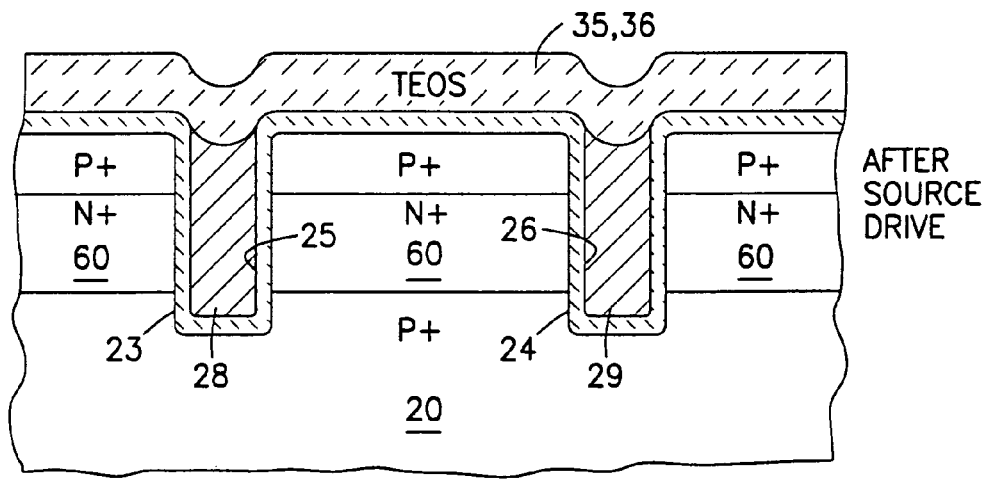

Next, and as shown in FIG. 10, a source drive is carried out to drive the P⁺ source regions into the silicon, driving at 850° C. for 30 minutes in nitrogen.

The final steps applied to the wafer of FIG. 10 produce the structure shown in FIG. 2, and include a contact mask step to open the contact windows, followed by the formation of N⁺⁺ layer 51 to improve the contact between the silicon and the aluminum source metal. The region 51 may be formed by a phosphorous implant with a dose of 1E15 and energy of 50 KeV. After suitable metal deposition preparation, aluminum front metal 40 is applied by sputtering to a thickness of 8 μm.

Thereafter, the wafer 20 is reduced in thickness to 210 μm as by grinding, and the back metal or drain 41 is suitably deposited, forming the device as shown in FIG. 2.

In carrying out the above process, a trench width of 0.6 μm and a mesa width of 1.8 μm have been used. Other dimensions can be selected. Further, a square cell has been used, although a stripe can be used. After completion of the wafer, die have been formed with dimensions of 75 mils×90 mils with 88% being active area. Larger die sizes of 102 mils (2.591 mm)× 157 mils (3.988 mm) with 92% being active area, have also been used.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power MOSFET having reduced on resistance comprising:
a P+ conductivity substrate; an epitaxially deposited N+ conductivity layer deposited atop said P+ substrate to form an epitaxial layer having a substantially uniform concentration of N type dopants throughout its volume; a plurality of spaced stripe trenches having vertical walls extending through said epitaxial layer into said P+ conductivity substrate; a thin gate oxide on said vertical walls and conductive polysilicon with a P type conductivity deposited into said trenches to define a polysilicon gate; P+ concentration source region stripes formed adjacent the walls of each of said trenches and diffused into the top of said epitaxial layer; a plurality of spaced notches extending through said source regions and exposing said epitaxially deposited layer; an N++ region formed in said N+ epitaxially deposited layer at bottom of each notch; a source contact connected to at least said source regions; and a drain contact made of metal and connected to a bottom surface of said substrate, wherein the doping of said N+ epitaxially deposited layer allows reverse voltage to be blocked therein and wherein said source contact extends through said plurality of notches and is connected to each said N++ region.

2. The MOSFET of claim 1, wherein said epitaxial layer has a resistivity of about 0.17 ohm cm and a thickness of about 2.5 μm.

3. The MOSFET of claim 1, wherein said substrate is a P⁺ substrate having a resistivity of less than about 0.005 ohm cm.

4. The MOSFET of claim 1, wherein said substrate is not thicker than 210 μm.

* * * * *